(12) United States Patent
Salling et al.

(10) Patent No.: US 9,414,448 B2
(45) Date of Patent: Aug. 9, 2016

(54) STABILITY OF AN OPTICAL SOURCE IN AN OPTICAL NETWORK TEST INSTRUMENT

(71) Applicant: Fluke Corporation, Everett, WA (US)

(72) Inventors: Jackson Salling, Austin, TX (US); J. David Schell, Austin, TX (US)

(73) Assignee: Fluke Corporation, Everett, WA (US)

( * ) Notice: Subject to any disclaimer, the term of this patent is extended or adjusted under 35 U.S.C. 154(b) by 253 days.

(21) Appl. No.: 14/145,443

(22) Filed: Dec. 31, 2013

(65) Prior Publication Data
US 2015/0189709 A1 Jul. 2, 2015

(51) Int. Cl.
H01S 5/02 (2006.01)
H05B 33/08 (2006.01)
H01S 5/024 (2006.01)
H01S 5/0683 (2006.01)
G01K 13/00 (2006.01)
H05B 37/02 (2006.01)
H01S 5/06 (2006.01)

(52) U.S. Cl.
CPC ............ *H05B 33/0809* (2013.01); *G01K 13/00* (2013.01); *H01S 5/02453* (2013.01); *H01S 5/06837* (2013.01); *H05B 37/02* (2013.01); *H01S 5/0617* (2013.01)

(58) Field of Classification Search
CPC H01S 5/02453; H01S 5/06837; H01S 5/0617
See application file for complete search history.

(56) References Cited

U.S. PATENT DOCUMENTS

| 2005/0078722 | A1 | 4/2005 | Wu et al. | |
| 2012/0020381 | A1 | 1/2012 | Ishizaka | |
| 2015/0086194 | A1* | 3/2015 | Kassler | H04B 10/0773 398/28 |
| 2015/0146751 | A1* | 5/2015 | Downing | H05B 33/0851 372/38.01 |

FOREIGN PATENT DOCUMENTS

JP 2010004639 A 1/2010

OTHER PUBLICATIONS

European Search Report for corresponding European Application No. 14197811.4 dated Sep. 18, 2015.

* cited by examiner

Primary Examiner — Armando Rodriguez
(74) Attorney, Agent, or Firm — Locke Lord LLP; Scott D. Wofsy; Christopher J. Capelli

(57) ABSTRACT

A self-contained calibration method for improving stability of an optical source in an optical network test instrument includes performing a temperature sweep test of the optical source. Optical output power of the optical source is periodically measured. A temperature correcting value is generated based on the measured optical output power. The optical output power of the optical source is adjusted by applying the temperature correcting value to obtain a substantially constant optical output power of the optical source.

19 Claims, 4 Drawing Sheets

STABILITY OF AN OPTICAL SOURCE IN AN OPTICAL NETWORK TEST INSTRUMENT

FIELD OF THE INVENTION

Embodiments of the present invention relate to fiber optic transmitters, and particularly to improving stability of an optical source in an optical network test instrument.

BACKGROUND OF THE INVENTION

The development of digital technology has provided electronic access to a vast amount of information. The increased access to information has fueled an increasing desire to quickly obtain and process the information. This desire has, in turn, placed ever increasing demands for faster and higher capacity electronic information processing equipment (computers) and transmission networks and systems linking the processing equipment (i.e., telephone lines, cable television (CATV) systems, local, wide and metropolitan area networks (LAN, WAN, and MAN). In response to these demands, many transmission systems in use today either have been or will be converted from electrical to optical networks. Optical transmission systems provide substantially larger information transmission bandwidths than electrical systems. Optical transmission systems employ optical fiber in the form of fiber optic cables. Since fiber optic cables are subject to accidents and can become degraded in their performance, it has become increasingly important to be able to test both the communication media and systems to assure that faults are rapidly detected, located efficiently, and quickly fixed.

It may be necessary in installing and/or servicing fiber optic networks to be able to measure insertion loss within an optical network. Insertion loss within an optical network should be determined to be within acceptable limits in order to verify proper physical contact between adjoining optical fibers and to maintain the system loss budget. Currently, one specified way of determining insertion loss is with the use of a hand-held optical network test instrument, which measures the insertion loss through a length of optical fiber that may include one or more joining points between adjoining optical fibers. Such optical network test instrument typically includes one or more optical sources. One of concerns for optical sources in network test instruments is performance. Performance issues may include laser stability under various conditions.

To improve loss test accuracy, it is desirable to improve stability of optical sources in optical network test equipment.

SUMMARY OF THE INVENTION

The purpose and advantages of the illustrated embodiments will be set forth in and apparent from the description that follows. Additional advantages of the illustrated embodiments will be realized and attained by the devices, systems and methods particularly pointed out in the written description and claims hereof, as well as from the appended drawings.

In accordance with a purpose of the illustrated embodiments, in one aspect, a method for improving stability of an optical source in an optical network test instrument is provided. A temperature sweep test of the optical source is performed. Optical output power of the optical source is periodically measured. A temperature correcting value is generated based on the measured optical output power. The output power of the optical source is adjusted by applying the temperature correcting value to obtain a substantially constant optical output power of the optical source.

In another aspect, a computer program product for improving stability of an optical source in an optical network test instrument is provided. The computer program product comprises one or more computer-readable storage devices and a plurality of program instructions stored on at least one of the one or more computer-readable storage devices. The plurality of program instructions includes program instructions to perform a temperature sweep test of the optical source. The plurality of program instructions further includes program instructions to periodically measure optical output power of the optical source. The plurality of program instructions further includes program instructions to generate a temperature correcting value based on the measured optical output power of the optical source. The plurality of program instructions further includes program instructions to adjust the output power of the optical source by applying the temperature correcting value to obtain a substantially constant optical output power of the optical source.

BRIEF DESCRIPTION OF THE DRAWINGS

The accompanying appendices and/or drawings illustrate various, non-limiting, examples, inventive aspects in accordance with the present disclosure.

DETAILED DESCRIPTION OF CERTAIN EMBODIMENTS

Figure 1:
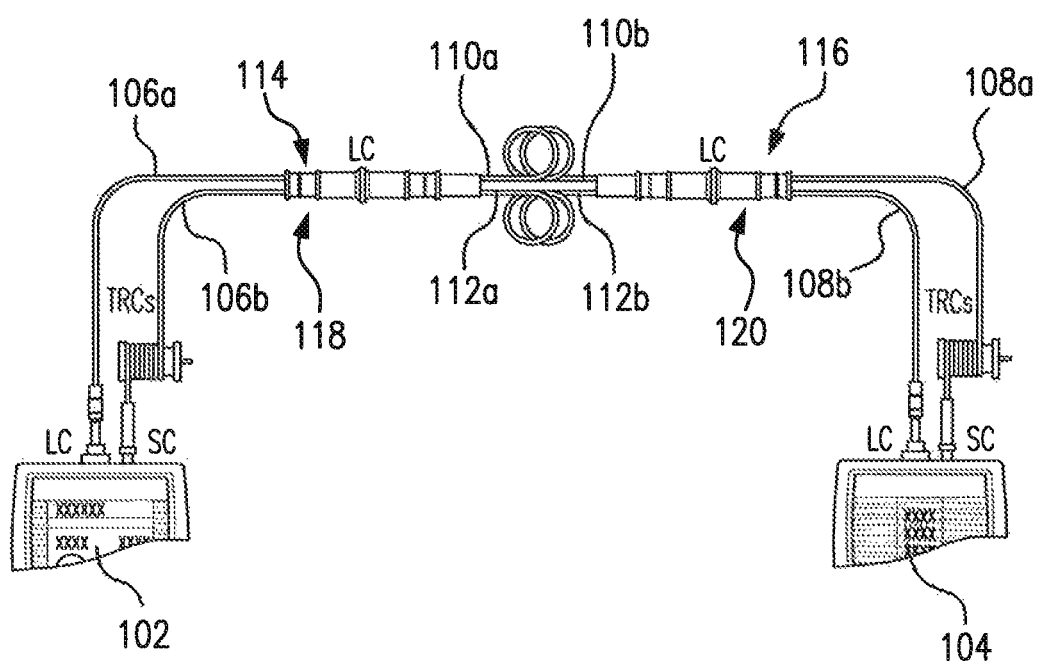
FIG. 1 is a diagram illustrating a test set up in accordance with the prior art.

The present invention is now described more fully with reference to the accompanying drawings, in which illustrated embodiments of the present invention is shown wherein like reference numerals identify like elements. The present invention is not limited in any way to the illustrated embodiments as the illustrated embodiments described below are merely exemplary of the invention, which can be embodied in various forms, as appreciated by one skilled in the art. Therefore, it is to be understood that any structural and functional details disclosed herein are not to be interpreted as limiting, but merely as a basis for the claims and as a representative for teaching one skilled in the art to variously employ the present invention. Furthermore, the terms and phrases used herein are not intended to be limiting but rather to provide an understandable description of the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, exemplary methods and materials are now described. All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided may differ from the actual publication dates which may need to be independently confirmed.

It must be noted that as used herein and in the appended claims, the singular forms "a", "an," and "the" include plural referents unless the context clearly dictates otherwise. Thus, for example, reference to "a stimulus" includes a plurality of such stimuli and reference to "the signal" includes reference to one or more signals and equivalents thereof known to those skilled in the art, and so forth.

It is to be appreciated the embodiments of this invention as discussed below are preferably a software algorithm, program or code residing on computer useable medium having control logic for enabling execution on a machine having a computer processor. The machine typically includes memory storage configured to provide output from execution of the computer algorithm or program.

As used herein, the term "software" is meant to be synonymous with any code or program that can be in a processor of a host computer, regardless of whether the implementation is in hardware, firmware or as a software computer product available on a disc, a memory storage device, or for download from a remote machine. The embodiments described herein include such software to implement the equations, relationships and algorithms described below. One skilled in the art will appreciate further features and advantages of the invention based on the below-described embodiments. Accordingly, the invention is not to be limited by what has been particularly shown and described, except as indicated by the appended claims.

The method according to a preferred embodiment of the present invention is directed to techniques to improve stability of an optical source in an optical network test instrument. According to an embodiment of the present invention, various intelligent components of the network test instrument learn how the optical source behaves in its specified operating environment and adapt the control accordingly to maintain stable and accurate operating characteristics (such as optical output power) over the specified operating conditions. According to a preferred embodiment, the learned behavior and characteristics of the optical source are stored in an internal memory of the optical network test instrument. Advantageously, the improved stability of the optical source can improve accuracy of an insertion loss test, performed by the network test instrument, by reducing uncertainty factor of the optical source.

As previously discussed, it is common practice to test loss and/or length of optical fiber after installation, repair, moves/adds/updates, and the like. To date, most common topology consists of single-fiber connectors attached to single strands of fiber. These fibers are typically used in a duplex topology such that one fiber transmits network traffic in one direction and the other fiber transmits in the opposite direction. The individual fibers are often bundled into a large group within a cable but then individually terminated with a connector at each end of the fiber. FIG. 1 illustrates this common practice applied to a duplex fiber system wherein a main test unit 102 is connected to a fiber at a break-out and a remote test unit 104 is connected to the corresponding fiber at a remote end of the cable, and testing is performed by utilization of the two units 102 and 104.

As shown in FIG. 1, the exemplary test set up employs two duplex test reference cords (TRCs) 106 and 108. First duplex cord 106 consists of two strands of fiber, for example, fibers 106a and 106b. Second duplex cord 108 also consists of two strands of fiber, for example, fibers 108a and 108b. Each strand of the TRCs 106 and 108 is terminated with a suitable fiber optic connector interface such as SC, ST, LC, or the like. In the illustrated set up, the optical fiber link under test comprises a pair of fibers (fibers 110 and 112). At one end 110a the first fiber 110 is connected to the main unit 102 via a LC connector 114, while the opposite end 110b of the first fiber 110 is connected to the remote unit 104 via the LC connector 116. Similarly, at one end 112a the second fiber 112 is connected to the main unit 102 via the LC connector 118, while the opposite end 112b of the second fiber 112 is connected to the remote unit 104 via the LC connector 120.

When both main 102 and remote 104 units are connected to the optical fiber link under test (i.e., fibers 110 and 112), the network test instrument can measure a total insertion loss of the fiber link under test. The light source (shown in FIG. 2) at each unit emits a continuous wave at the selected wavelengths through the respective output ports. On the distant end, the power meters measure the level of optical power they are receiving through the input ports and compare it to the reference power level in order to calculate the total amount of light loss.

Figure 2:
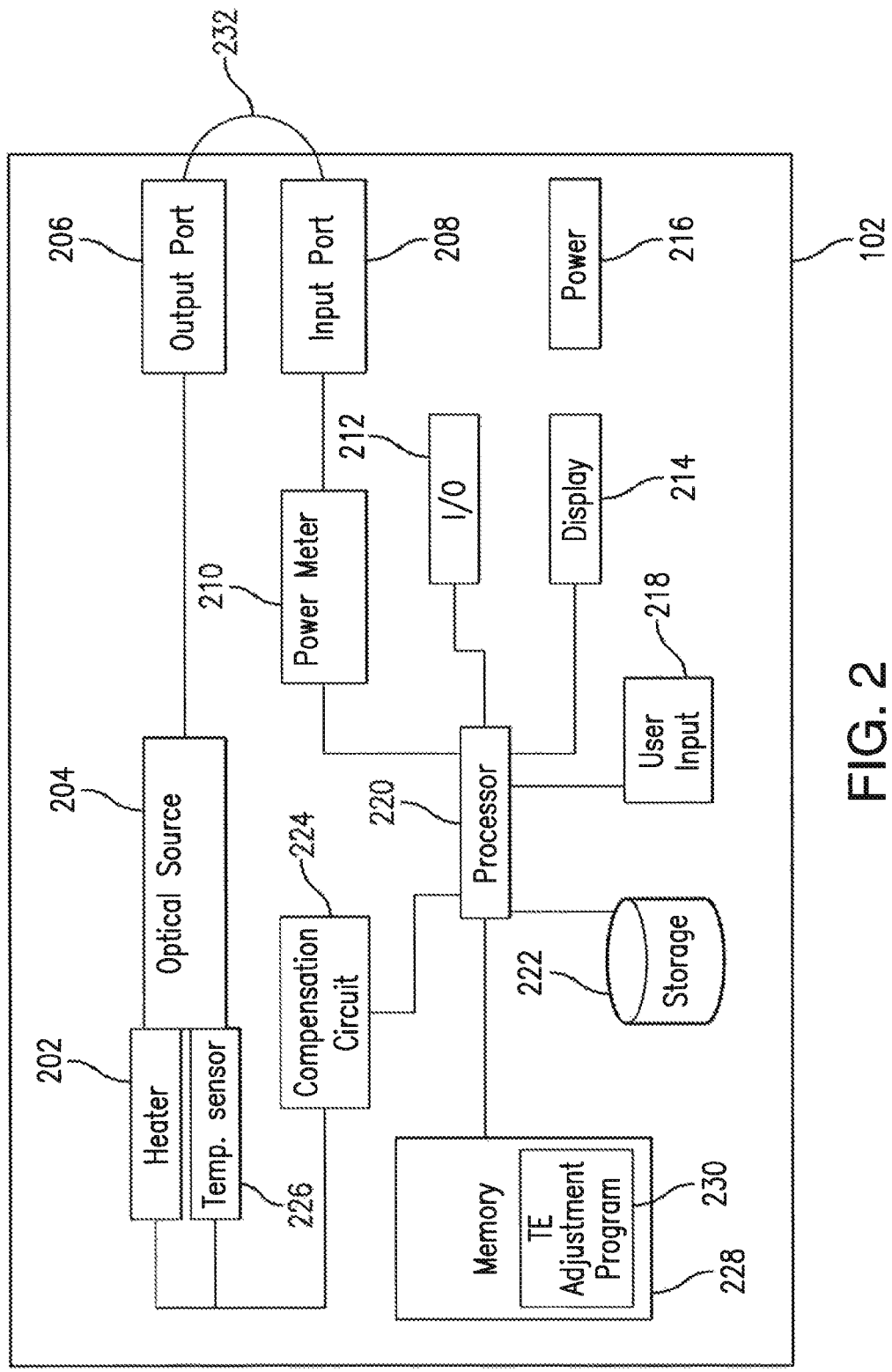
FIG. 2 is a block diagram of a network test instrument, in accordance with an illustrative embodiment of the present invention.

FIG. 2 is a block diagram of the main unit 102 of the network test instrument, in accordance with an illustrative embodiment of the present invention. For simplicity, this main unit 102 will be referred to as a "network test instrument" hereafter. In a preferred embodiment, the network test instrument 102 may comprise at least one optical source 204. The lasers that can be utilized as optical sources 204 in various embodiments of the present invention include, but are not limited to, light emitting diodes (LEDs), fiber lasers, frequency doubled fiber lasers, diode lasers, frequency doubled diode lasers or combinations thereof. In a preferred embodiment, optical source 204 is a diode laser capable of continuous wave (CW) or modulated transmission, which may be terminated at the output port 206 of the network test instrument 102. The input port 208 of the network test instrument 102 is used for the power meter portion of the test instrument and may contain or be connected to an optical power meter 210. The power meter 210 converts the transmitted light to electrical energy which is supplied to and then amplified by the operational amplifier (not shown in FIG. 2), whose gain can be varied to detect a wide range of optical power levels. In order to measure the optical power of the optical source 204, the output port 206 of the network test instrument 102 may be connected to the input port 208 of the network test instrument 102 by one of the test reference cords, such as, for example, but not limited to, one of the strands of the TRCs 106 and 108 (shown in FIG. 1). It is noted that during testing the light transmitted by the optical source 212 travels from the output port 206 to the input port 208.

As the temperature of the optical source 204 fluctuates, so does the optical output power. However, it is desired for the output power to be consistent and therefore predictable during operation. Thus, maintaining the temperature of the optical source 204 at a constant level irrespective of ambient temperature is desirable. In a preferred embodiment of the present invention, a heater 202 may be operatively connected to the optical source 204 for heating and maintaining the optical source 204 at a substantially constant temperature. In addition, one or more temperature sensors 226 may be in contact with the optical source 204 or in close proximity to the optical source 204. The temperature sensor 226 may provide an output signal representing the temperature of the optical source 204 to a temperature compensation circuit 224.

In an embodiment of the present invention, the temperature compensation circuit 224 may be provided in the network test instrument 102 to control the output of the heater 202 as a function of output power of the optical source 204. The power meter 210 periodically monitors the power of the optical source 204 and supplies measurements to a tracking error adjustment program 230 (described below). In response to receiving these measurements, the tracking error adjustment program 230 preferably generates a temperature correcting value based on the measured optical output power. In addition, the tracking error adjustment program 230 preferably adjusts the temperature of the optical source 204, via the temperature compensation circuit 224 and the heater 202 to obtain an operating temperature for the optical source 204 in which the optical source 204 produces substantially constant output power. In an alternative embodiment, a heat sink (not shown in FIG. 2) may be coupled to the optical source 204, instead of the heater 202, to passively cool it off, thus effectively maintaining the optical source 204 at a substantially constant temperature. As used herein, the term "heat sink" refers to any component or assembly that takes heat away from the optical source 204.

One or more microprocessor(s) (CPU) 220 may comprise hardware elements or hardware logic adapted to execute the software programs and manipulate the data structures. The one or more microprocessor(s) 220 may execute, for example, the tracking error adjustment program 230. The tracking error adjustment program 230 may comprise program instructions stored on one or more computer-readable storage devices, which may include internal memory 228 and/or internal storage 222 of the network test instrument 102. The tracking error adjustment program 230 may be, for example, a computer program or program component for controlling temperature adjustment of the optical source 204 based on the determined thermal correction factors. Data gathered, generated, and maintained for use by the tracking error adjustment program 230 may be kept in the internal storage 222 of the main network test instrument 102. A power block 216 may provide the power source to operate the network test instrument 102, suitably battery power for portably hand-held use. I/O 212 may provide one or more interfaces with the user of the network test instrument 102, and may include a display 214 and input devices 218, such as cursor control keys and other keys for allowing user operation and display/output of results.

Figure 3:
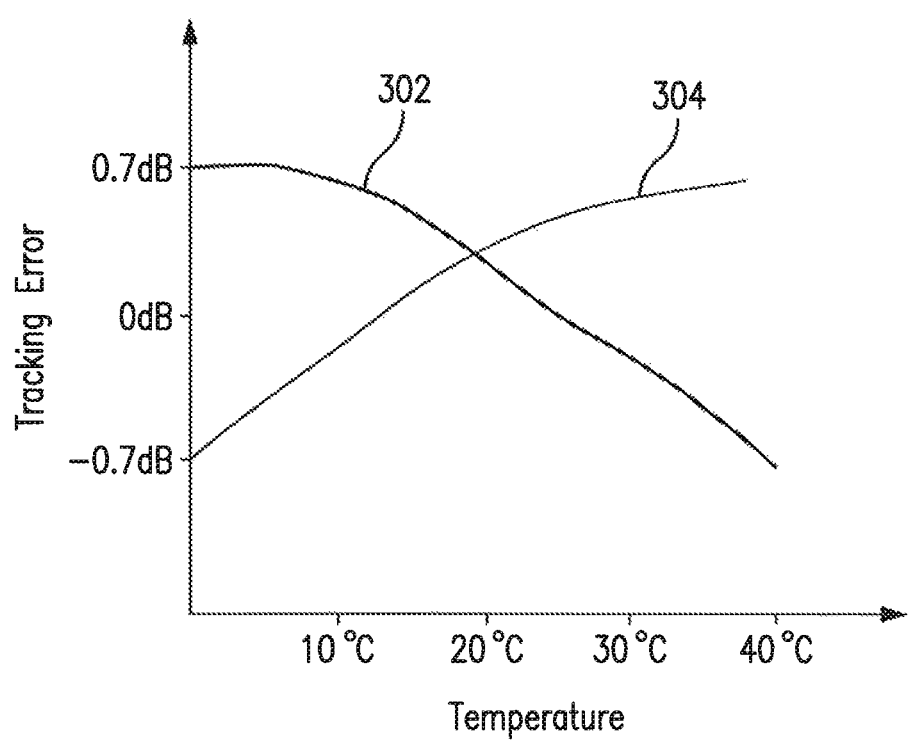
FIG. 3 is a plot diagram showing the relation between tracking error values and temperature.

FIG. 3 is a plot diagram showing the relation between tracking error values and temperature. As used herein, the term "tracking error" refers to a parameter that defines how the output power of an optical source varies with temperature. Tracking error is a measure of the maximum deviation of this relationship from linearity. These deviations are primarily due to mismatches in the thermal coefficients of expansion for the materials that make up the optical components of the network test instrument 102. Tracking error varies from device to device and the manufacturers of the optical network test instruments typically define acceptable limits or range (e.g., approximately ±0.2 dBs per 10° C.). Thus, the variation is a function of temperature, but the variation is not consistent between devices.

Referring back to FIG. 3, plots 302 and 304 illustrate tracking error values versus temperature for two distinct network test instruments. As can be seen in FIG. 3, tracking error is not constant and may even reverse direction in some instruments. Since there are several complicated factors in determining the cause of tracking error and since tracking error is not constant, it cannot be easily compensated for like other temperature-dependent parameters. Accordingly, a preferred embodiment of the present invention contemplates the use of a software program, such as tracking error adjustment program 230, during operation of the network test instrument 102 to cancel the effects of tracking error.

Figure 4:
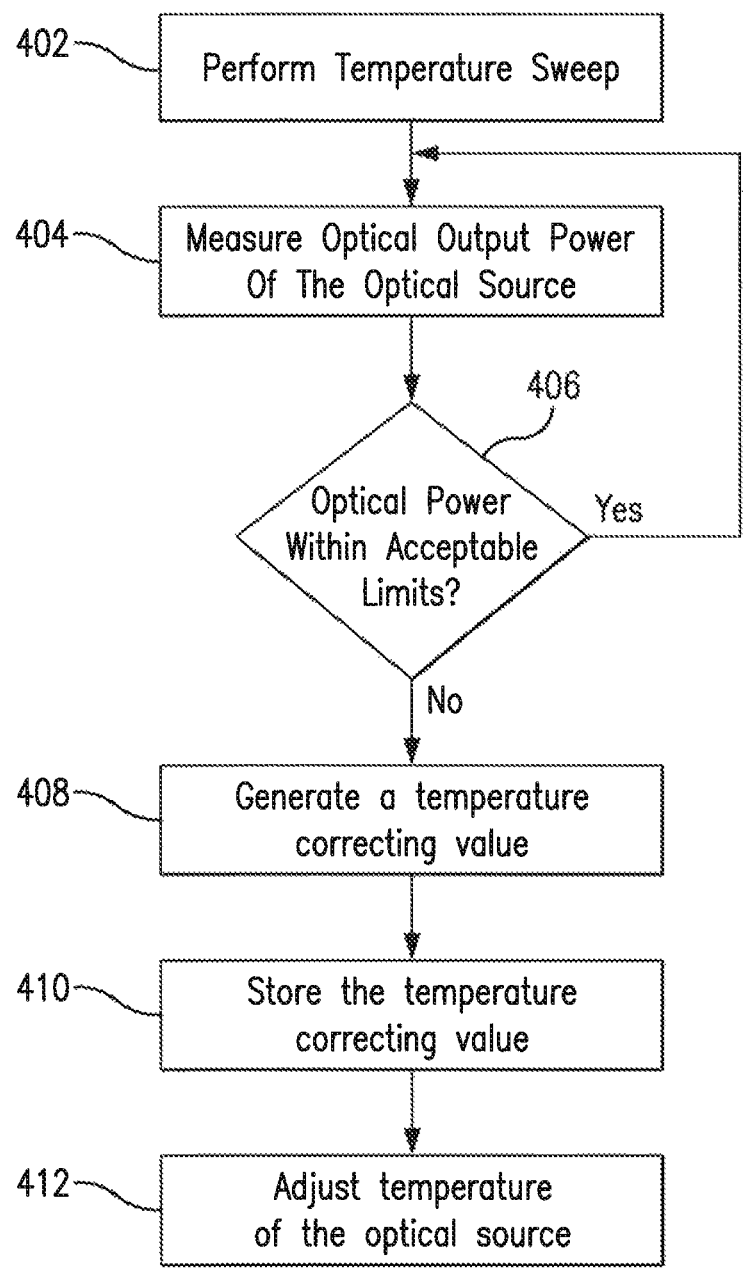
FIG. 4 is a flowchart of operational steps of the tracking error adjustment program of FIG. 2, in accordance with an illustrative embodiment of the present invention.

FIG. 4 is a flowchart of operational steps of the tracking error adjustment program 230 of FIG. 2, in accordance with an illustrative embodiment of the present invention. The tracking error adjustment program 230 may be, for example, a computer program or program component for improving stability of an optical source 202 of the network test instrument 102 by cancelling the effects of tracking error. The steps described below comprise a self-contained calibration process of the network test instrument 102. For illustrative purposes it is assumed that the output 206 is connected to the input port 208 by an external patch cord, as described above in connection with FIG. 2. After the optical source 204 is turned on, at step 402, the tracking error adjustment program 230 preferably performs a temperature sweep test of the optical source 204. In a preferred embodiment, the heater 202, operatively coupled to the optical source 204, performs the temperature sweep test under control of the tracking error adjustment program 230. During the sweep test, the tracking error over the entire desired operating temperature range can be characterized as a characteristic curve. This characteristic curve can be sampled at predetermined sampling points. The number of sampling points can be selected arbitrarily, e.g. as many as needed. Advantageously, due to the fact that the heater element 202 is integrated close to the optical source 204 itself, all heating power is focused directly to the optical source structure 204. Sampling can thus be done with a fast temperature sweep over the whole desired temperature range. The obtained sampling points can be stored in the storage component 222 of the network test instrument 102.

After performing the temperature sweep test and after obtaining a stable operating temperature of the optical source 204, at step 404, the tracking error adjustment program 230 preferably continuously measures optical power output of the optical source 204 during the calibration of the network test instrument 102. In an embodiment of the present invention this step preferably involves obtaining periodic measurement data from one or more power meters 210 operatively coupled to the optical source 204 via output 206 and input 208 ports, respectively, as shown in FIG. 2.

Next, at step 406, the tracking error adjustment program 230 preferably determines whether the measured optical output power of the optical source 204 is within acceptable limits. Preferably, the measured optical output power gain/loss should not exceed 0.05 dBs, irrespective of ambient temperature. In response to determining that the measured optical output power of the optical source 204 is within the acceptable range (step 406, yes branch), the tracking error adjustment program 230 may take next measurements after a predetermined period of time (step 404). In other words, if the tracking adjustment program 230 determines that the optical source produces acceptable output it may not be necessary to compensate for tracking error changes.

However, in response to determining that the measured optical output power of the optical source 204 is outside acceptable range (step 406, no branch), the tracking error adjustment program 230 preferably generates a temperature correcting value, at step 408. In an embodiment of the present invention, the temperature correcting value comprises tracking error value. As discussed earlier in connection with FIG. 3, a curve describing the tracking error values as a function of temperature can be established. In one embodiment of the present invention, the tracking error adjustment program 230 preferably represents the tracking error values as (x, y) pairs, where x represents temperature and y represents tracking error adjustment value. In other words, there are discrete data points over the operating temperature range that describe tracking error as a function of temperature.

In an alternative embodiment, the tracking error adjustment program 230 preferably uses these discrete data points, to preferably define functions y=f(x) that very closely match the actual data. These functions may then be used to solve, interpolate, and the like, for temperature values that were not part of the raw measured data at step 404. Polynomials are generally used as approximating functions because of their simplicity and speed of calculation, and such polynomials may be used in the alternative embodiment of the present invention. The tracking error adjustment program 230 preferably uses a polynomial curve fit to determine the approximated functions y=f(x). Polynomial curve fitting results in a single polynomial equation of order N, which is the least squares approximation of the original data measurements. Polynomial curve fitting is actually a case of least squares multiple regression. A polynomial equation (1) may be of the form:

$$y = c_0 + c_1 x^1 + c_2 x^2 + c_3 x^3 + \ldots + c_n x^n \qquad (1)$$

In other words, in the alternative embodiment of the present invention, the tracking error adjustment program 230, at step 408, preferably estimates the temperature correcting values (tracking error values) using a polynomial curve fit, as described above.

Next, at step 410, the tracking error adjustment program 230 optionally stores the calculated temperature correcting values and/or obtained optical power measurements, for example, in the storage 222 of the network test instrument 102. In a preferred embodiment of the present invention, the tracking error adjustment program 230 loads this data in the form of a table with values computed at step 408 associated with a given temperature or with polynomial coefficients. Each entry in such table may indicate the values to be used for the corresponding temperature. Each line entry in the table may represent an incremental change in temperature. The temperature step per table entry can be as large or as small as desired and is only limited by the available memory in the storage 222 of the network test instrument 102.

At step 412, the tracking error adjustment program 230 preferably adjusts the temperature of the optical source 204 based, for example, on the temperature correcting values determined at step 408. According to an embodiment of the present location, the tracking error adjustment program 230 is preferably configured to communicate with a compensation circuit 224. The compensation circuit 224 is preferably provided to control the temperature of the heater 202. In one implementation, if the tracking error adjustment program 230 determines that the optical power of the optical source 204 is not within the aforementioned acceptable range, the compensation circuit 210 may suitably adjust the output (power) of the optical source 204 based on the temperature correcting values provided by the tracking error adjustment program 230 in order to maintain a substantially constant optical output power of the optical source 204.

In summary, the various embodiments of the present invention provide a cost effective method for improving stability of an optical source in a self-contained environment of an optical network test instrument. Advantageously, various components of the network test instrument learn how the optical source behaves in its specified operating environment and adapt the control accordingly to maintain stable and accurate operating characteristics over the specified operating conditions.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages.

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for improving stability of an optical source in an optical network test instrument, the method comprising the steps of:
    optically connecting an output port of the network test instrument to an input port of the network test instrument by an external optical fiber;
    transmitting an optical output signal generated by the optical source out of the network test instrument through the output port, wherein the transmitted optical signal travels from the output port to the input port of the network test instrument through the external optical fiber;
    performing a temperature sweep test of the optical source to generate a tracking error characteristic curve associated with the optical source;
    internally measuring optical output power of the optical signal generated by the optical source using a power meter component integrated within the network test instrument, the power meter optically connected with the input port;
    generating a temperature correcting value based on the internally measured optical output power and based on the generated tracking error characteristic curve; and
    adjusting the optical output power of the optical source by applying the temperature correcting value to obtain a substantially constant optical output power of the optical source.

2. The method of claim 1, wherein the temperature sweep test is performed by a heater operatively coupled to the optical source.

3. The method of claim 1, wherein one or more temperature sensors are operatively coupled to the optical source.

4. The method of claim 3, wherein the one or more temperature sensors generate an output signal indicative of the temperature of the optical source.

5. The method of claim 1, wherein the temperature correcting value comprises a temperature correction curve polynomial value.

6. The method of claim 1, further comprising, after generating the temperature correcting value, storing the temperature correcting value in the optical network test instrument.

7. The method of claim 1, wherein adjusting the optical output power of the optical source is controlled by a compensation circuit component of the optical network test instrument.

8. The method of claim 1, wherein the optical source comprises at least one of a light emitting diode (LED), a fiber laser, a frequency doubled fiber laser, a diode laser, a frequency doubled diode laser or combinations thereof.

9. A computer program product for improving stability of an optical source in an optical network test instrument, the computer program product comprising:
    one or more computer-readable storage devices and a plurality of program instructions stored on at least one of the one or more computer-readable storage devices, the plurality of program instructions comprising:
    program instructions to transmit an optical output signal generated by the optical source out of the network test instrument through an output port, wherein the transmitted optical signal travels from the output port to the input port of the network test instrument through an external optical fiber;
    program instructions to perform a temperature sweep test of the optical source to generate a tracking error characteristic curve associated with the optical source;
    program instructions to internally measure optical output power of the optical signal generated by the optical source using a power meter component integrated within the network test instrument, the power meter optically connected with the input port;
    program instructions to generate a temperature correcting value based on the internally measured optical output power and based on the generated tracking error characteristic curve; and
    program instructions to adjust the optical output power of the optical source by applying the temperature correcting value to obtain a substantially constant optical output power of the optical source.

10. The computer program product of claim 9, wherein the program instructions to perform the temperature sweep test comprise program instructions to control a heater operatively coupled to the optical source.

11. The computer program product of claim 9, wherein one or more temperature sensors are operatively coupled to the optical source.

12. The computer program product of claim 11, further comprising program instructions to receive from the one or more temperature sensors an output signal indicative of the temperature of the optical source.

13. The computer program product of claim 9, wherein the temperature correcting value comprises a temperature correction curve polynomial value.

14. The computer program product of claim 9, further comprising program instructions to store the temperature correcting value in the optical network test instrument.

15. The computer program product of claim 9, wherein program instructions to adjust the optical output power of the optical source comprise program instructions to control a compensation circuit component of the optical network test instrument.

16. The computer program product of claim 9, wherein the optical source comprises at least one of a light emitting diode (LED), a fiber laser, a frequency doubled fiber laser, a diode laser, a frequency doubled diode laser or combinations thereof.

17. An optical network test instrument comprising:
an optical source for generating a continuous optical signal;
an output port optically connected to the optical source for transmitting the generated optical signal out of the network test instrument;
an input port optically connected to the output port by an external optical fiber for receiving the transmitted optical signal;
a power meter component optically connected to the input port for internally measuring optical output power of the optical signal generated by the optical source;
one or more temperature sensors disposed within the network test instrument near the optical source for measuring temperature of the optical source;
a processor operatively coupled to the power meter and to the one or more temperature sensors, the processor configured to:
generate a tracking error characteristic curve associated with the optical source by performing a temperature sweep;
receive internally measured optical output power of the optical signal generated by the optical source from the power meter component;
generate a temperature correcting value based on the internally measured optical output power and based on the generated tracking error characteristic curve; and
adjust the optical output power of the optical source by applying the temperature correcting value to obtain a substantially constant optical output power of the optical source.

18. The optical network test instrument of claim 17 further comprising a heater for performing the temperature sweep, the heater disposed within the network test instrument near the optical source.

19. The optical network test instrument of claim 17, wherein the one or more temperature sensors generate an output signal indicative of the temperature of the optical source.

* * * * *